United States Patent
Zhang et al.

(10) Patent No.: US 12,125,932 B2
(45) Date of Patent: Oct. 22, 2024

(54) STACKED SOLAR CELL

(71) Applicant: BEIJING ZENITHNANO TECHNOLOGY CO., LTD., Beijing (CN)

(72) Inventors: Yuchun Zhang, Beijing (CN); Shudong Zhong, Beijing (CN)

(73) Assignee: BEIJING ZENITHNANO TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 18/689,439

(22) PCT Filed: Oct. 12, 2021

(86) PCT No.: PCT/CN2021/123373
§ 371 (c)(1),
(2) Date: Mar. 6, 2024

(87) PCT Pub. No.: WO2023/039966
PCT Pub. Date: Mar. 23, 2023

(65) Prior Publication Data
US 2024/0266453 A1 Aug. 8, 2024

(30) Foreign Application Priority Data
Sep. 16, 2021 (CN) .......................... 202111096403.7

(51) Int. Cl.
*H01L 31/0725* (2012.01)
*H01L 31/0216* (2014.01)
(Continued)

(52) U.S. Cl.
CPC .... *H01L 31/0725* (2013.01); *H01L 31/02167* (2013.01); *H01L 31/02168* (2013.01);
(Continued)

(58) Field of Classification Search
CPC ..... H01L 31/022466; H01L 31/022491; H01L 31/02167; H01L 31/02168; H01L 31/0725; H01L 31/0747
See application file for complete search history.

(56) References Cited

U.S. PATENT DOCUMENTS

2007/0096085 A1 5/2007 Rand et al.
2009/0084438 A1* 4/2009 den Boer ........ H01L 31/022466
136/256

FOREIGN PATENT DOCUMENTS

CN 102834929 A 12/2012
CN 208548372 U 2/2019
(Continued)

OTHER PUBLICATIONS

English machine translation of CN 111430384. (Year: 2020).*
(Continued)

*Primary Examiner* — Lindsey A Buck
(74) *Attorney, Agent, or Firm* — Bayramoglu Law Offices LLC

(57) ABSTRACT

A stacked solar cell is provided. The stacked solar cell comprises: a light absorption layer group comprising an excitation layer, a first electron transport layer group provided on a first side surface of the excitation layer, and a first hole transport layer group provided on a second side surface of the excitation layer; and a heterojunction layer group, wherein a second electron transport layer is provided as a first side surface of the heterojunction layer group and is in contact with the first hole transport layer group, and a second hole transport layer is provided as a second side surface of the heterojunction layer group.

19 Claims, 2 Drawing Sheets

(51) Int. Cl.
*H01L 31/0224* (2006.01)
*H01L 31/028* (2006.01)
*H01L 31/043* (2014.01)
*H01L 31/0747* (2012.01)

(52) U.S. Cl.
CPC .... *H01L 31/022466* (2013.01); *H01L 31/028* (2013.01); *H01L 31/0747* (2013.01); *H01L 31/043* (2014.12)

(56) References Cited

FOREIGN PATENT DOCUMENTS

| | | | | |
|---|---|---|---|---|
| CN | 110350087 | A | 10/2019 | |
| CN | 111081878 | A | 4/2020 | |
| CN | 111430384 | A | 7/2020 | |
| CN | 112164729 | A | 1/2021 | |
| EP | 2546887 | A1 * | 1/2013 | ....... H01L 31/03529 |
| EP | 3712967 | A1 | 9/2020 | |

OTHER PUBLICATIONS

D. T. Pierce, et al., Electronic Structure of Amorphous Si from Photoemission and Optical Studies, Physical Review B, 1972, pp. 3017-3029, vol. 5 No.8.

\* cited by examiner

STACKED SOLAR CELL

CROSS-REFERENCE TO THE RELATED APPLICATIONS

This application is the national phase entry of International Application No. PCT/CN2021/123373, filed on Oct. 12, 2021, which is based upon and claims priority to Chinese Patent Application No. 202111096403.7, filed on Sep. 16, 2021, the entire contents of which are incorporated herein by reference.

TECHNICAL FIELD

The present application relates to the field of photovoltaics, and in particular to a stacked solar cell.

BACKGROUND

A solar cell is a photoelectric semiconductor sheet that uses sunlight to directly generate electricity. The basic principle of the solar cell is that sunlight irradiates on a semiconductor p-n junction to form a hole-electron pair, and under the action of a built-in electric field of the p-n junction, a photogenerated hole flows to a p region, and a photogenerated electron flows to an n region, so that a current is generated after the circuit is turned on. Currently, the conversion efficiency of the solar cell is low and needs to be improved.

SUMMARY

In order to solve the above problem, the present invention provides a stacked solar cell, which comprises: a light absorption layer group comprising an excitation layer, a first electron transport layer group provided on a first side surface of the excitation layer, and a first hole transport layer group provided on a second side surface of the excitation layer; and a heterojunction layer group, wherein a second electron transport layer is provided as a first side surface of the heterojunction layer group and is in contact with the first hole transport layer group, and a second hole transport layer is provided as a second side surface of the heterojunction layer group; wherein under the irradiation of sunlight, both the excitation layer and the heterojunction layer group are excited, and an electron generated by the excitation layer is transported out of the stacked solar cell through the first electron transport layer; a hole generated by the excitation layer flows to the heterojunction layer group through the first hole transport layer group and recombines with an electron generated by the heterojunction layer group, and a hole generated by the heterojunction layer group is transported out of the stacked solar cell from the second hole transport layer.

In one embodiment, the first hole transport layer group comprises a hole transport layer in contact with the excitation layer, a PN junction in contact with the hole transport layer, and a first light transport layer in contact with the PN junction, the first light transport layer is in contact with the second electron transport layer, and a refractive index of the first light transport layer is smaller than that of the second electron transport layer.

In one embodiment, the first light transport layer has a refractive index of between 1.15 and 1.35 and a thickness of between 50 nm and 200 nm; the second electron transport layer has a refractive index of between 3.5 and 4.2 and a thickness of between 0 nm and 30 nm.

In one embodiment, the first light transport layer comprises: a first conductive layer in contact with the PN junction, a first protective layer in contact with the first conductive layer, a second conductive layer in contact with the first protective layer, a second protective layer in contact with the second conductive layer, and a light-exiting layer in contact with the second protective layer; wherein the first conductive layer has a first refractive index n1 and a first thickness d1, the first protective layer has a second refractive index n2 and a second thickness d2, the second conductive layer has a third refractive index n3 and a third thickness d3, the second protective layer has a fourth refractive index n4 and a fourth thickness d4, and the light-exiting layer has a fifth refractive index n5 and a fifth thickness d5; wherein n1 is between 1.8 and 2.1, and d1 is between 20 nm and 80 nm; n2 is between 0.1 and 5, and d2 is between 0.5 nm and 10 nm; n3 is between 0.1 and 1.5, and d3 is between 5 nm and 50 nm; n4 is between 1.3 and 2.1, and d4 is between 0.5 nm and 25 nm; n5 is between 1.4 and 2.4, and d5 is between 20 nm and 80 nm.

In one embodiment, the first conductive layer comprises a conductive metal oxide; the first protective layer comprises one of a metal, a conductive metal oxide, and a conductive metal nitride; the second conductive layer comprises a conductive material, and a metal oxide and/or a metal nitride; the second protective layer comprises one of a non-metal oxide, a metal nitride, and a metal oxide; the light-exiting layer comprises one of a non-metal oxide, a non-metal nitride, a non-metal sulfide, a non-metal fluoride, and a non-metal carbide.

In one embodiment, a material of the first conductive layer is selected from one of $In_2O_3$, $SnO_2$, ZnO, ITO, AZO, IZO, ITiO, IZTO, and FTO; a material of the first protective layer is selected from one of Si, Ti, Al, Ni, Cr, NiCr, TiN, ZnO, $TiO_2$, $SnO_2$, $SiO_2$, $Nb_2O_5$, $Ta_2O_5$, and $Si_3N_4$; a conductive material of the second conductive layer is selected from one of Ag, Cu, Al, Mo, an Ag alloy, a Cu alloy, an Al alloy, and an Mo alloy, and the second conductive layer further comprises an inclusion formed by an oxide and/or a nitride of the conductive material of the second conductive layer; a material of the second protective layer is selected from one of TiN, ZnO, $TiO_2$, $SnO_2$, $SiO_2$, $Si_3N_4$, AZO, IZO, and YZO; a material of the light-exiting layer is selected from one of $TiO_2$, $SnO_2$, ZnO, $Nb_2O_5$, $Ta_2O_5$, $Si_3N_4$, ZnS, $SiO_2$, $Al_2O_3$, MgF, MgS, SiC, AZO, GZO, and YZO.

In one embodiment, the heterojunction layer group comprises: an N-type Si wafer; a first intrinsic amorphous silicon layer on a first surface of the N-type Si wafer, the first intrinsic amorphous silicon layer being doped with oxygen; an N-type amorphous silicon layer on the first intrinsic amorphous silicon layer, the N-type amorphous silicon layer forming the second electron transport layer; a second intrinsic amorphous silicon layer on a second surface of the N-type Si wafer, the second intrinsic amorphous silicon layer being the same as the first intrinsic amorphous silicon layer; and a P-type amorphous silicon layer on the second intrinsic amorphous silicon layer, the P-type amorphous silicon layer forming the second hole transport layer.

In one embodiment, the first intrinsic amorphous silicon layer has an oxygen content of between 0 wt % and 30 wt %.

In one embodiment, a second light transport layer is further provided on an outer side of the P-type amorphous silicon layer, the second light transport layer is the same as the first light transport layer, and the P-type amorphous silicon layer has a refractive index of between 3.2 and 3.8 and a thickness of between 0 nm and 60 nm.

In one embodiment, the PN junction comprises an N-type nano-silicon layer in contact with the first light transport layer and a P-type nano-silicon layer on the N-type nano-silicon layer, and the P-type nano-silicon layer is in contact with the hole transport layer.

In one embodiment, the first electron transport layer group comprises an electron transport layer in contact with the excitation layer and a conductive layer in contact with the electron transport layer.

In one embodiment, a material of the conductive layer is $In_2O_3$, and a dopant is one or more of $Ga_2O_3$, $ZnO^2$, $CeO_2$, $TiO_2$, $Mo_2O_3$, $ZrO_2$, and $WO_2$; wherein $In_2O_3$ has a weight content of between 80 wt % and 100 wt %, and the balance is a dopant and an inevitable impurity; or a material of the conductive layer is ZnO, and a dopant is one or more of $SnO_2$, $Al_2O_3$, $Ga_2O_3$, and $B_2O_3$; wherein ZnO has a weight content of between 80 wt % and 100 wt %, and the balance is a dopant and an inevitable impurity.

Compared with the prior art, the present invention has the beneficial effects as follows: in the stacked solar cell of the present application, the heterojunction layer group helps amplify the number of hole-electron pairs generated by excitation of the light absorption layer group, so that the efficiency of the stacked solar cell is greatly improved.

BRIEF DESCRIPTION OF THE DRAWINGS

The drawings described herein are used for providing a further understanding of the present application and constitute a part of the present application. The illustrative embodiments of the present application and the descriptions thereof are used for explaining the present application and do not constitute undue limitation to the present application. In the drawings.

DETAILED DESCRIPTION OF THE EMBODIMENTS

In order to make the objects, technical solutions and advantages of the present application more clear, the technical solutions of the present application will be clearly and completely described below with reference to specific embodiments and corresponding accompanying drawings of the present application. Apparently, the described embodiments are merely a part, rather than all of the embodiments of the present application. Based on the embodiments in the present application, all other embodiments obtained by those of the ordinary skilled in the art without creative work shall fall within the protection scope of the present application.

Figure 1:
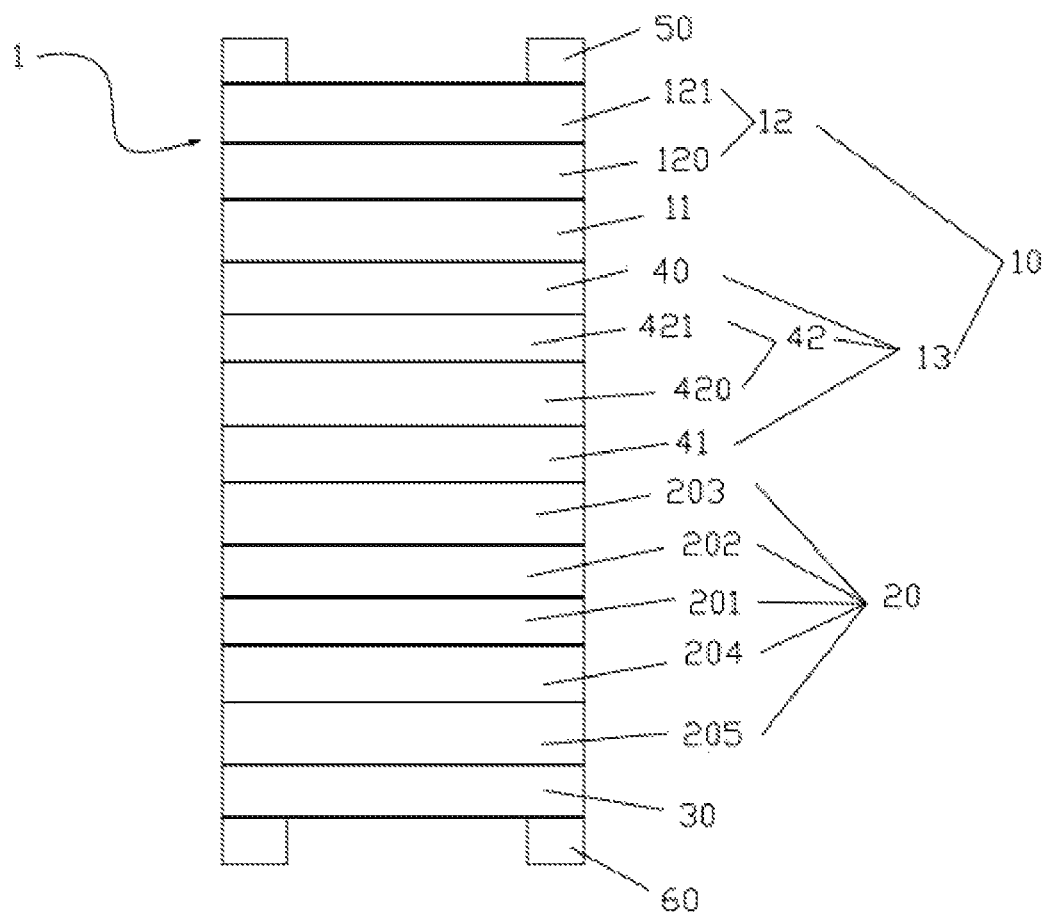
FIG. 1 schematically shows a stacked solar cell according to an embodiment of the present application.

FIG. 1 schematically shows the structure of a stacked solar cell 1 according to one embodiment of the present application. As shown in FIG. 1, the stacked solar cell 1 comprises: a light absorption layer group 10 and a heterojunction layer group 20 on an inner side (i.e., in a direction away from the external environment) of the light absorption layer group 10 and in contact therewith. The light absorption layer group 10 comprises an excitation layer 11, a first electron transport layer group 12 provided on a first side surface of the excitation layer 11, and a first hole transport layer group 13 provided on a second side surface of the excitation layer 11. A second electron transport layer 203 is provided as a first side surface of the heterojunction layer group 20 and is in contact with the first hole transport layer group 13. A second hole transport layer 205 is provided as a second side surface of the heterojunction layer group 20.

In the stacked solar cell 1, both the excitation layer 11 and the heterojunction layer group 20 are excited under irradiation of sunlight. An electron generated by the excitation layer 11 is transported out of the stacked solar cell 1 through the first electron transport layer 12. A hole generated by the excitation layer 11 flows to the heterojunction layer group 20 through the first hole transport layer group 13 and recombines with an electron generated by the heterojunction layer group 20. A hole generated by the heterojunction layer group 20 is transported out of the stacked solar cell 1 from the second hole transport layer 205. In this way, the heterojunction layer group 20 helps amplify the number of hole-electron pairs generated by excitation of the light absorption layer group 10, so that the efficiency of the stacked solar cell 1 is greatly improved.

In one embodiment, the first hole transport layer group 13 comprises a hole transport layer 40 in contact with the excitation layer 11, a PN junction 42 in contact with the hole transport layer 40, and a first light transport layer 41 in contact with the PN junction 42. The first light transport layer 41 is in contact with the second electron transport layer 203, and a refractive index of the first light transport layer 41 is smaller than that of the second electron transport layer 203. The inventors have found that the PN junction 42 is also excited under the irradiation of sunlight, so that the number of hole-electron pairs generated by the excitation of the light absorption layer group 10 is further amplified, thereby further improving the efficiency of the stacked solar cell 1. In addition, since the refractive index of the first light transport layer 41 is smaller than that of the second electron transport layer 203, an anti-reflection layer is formed, which contributes to irradiation of solar energy to the inside of the stacked solar cell 1 as much as possible (that is, more sunlight is irradiated to the heterojunction layer group 20) and excitation of the heterojunction layer group 20, thereby improving the efficiency of the stacked solar cell 1.

In one embodiment, the first light transport layer 41 has a refractive index of between 1.15 and 1.35 and a thickness of between 50 nm and 200 nm; the second electron transport layer 203 has a refractive index of between 3.5 and 4.2 and a thickness of between 0 nm and 30 nm. It should be understood that in the present application, the thickness of the second electron transport layer 203 is not equal to zero, but may be greater than zero. The inventors have found that setting the parameters of the first light transport layer 41 and the second electron transport layer 203 within this range enables sunlight to more efficiently enter the inside of the stacked solar cell 1, thereby contributing to the improvement in the efficiency of the stacked solar cell 1.

Figure 2:
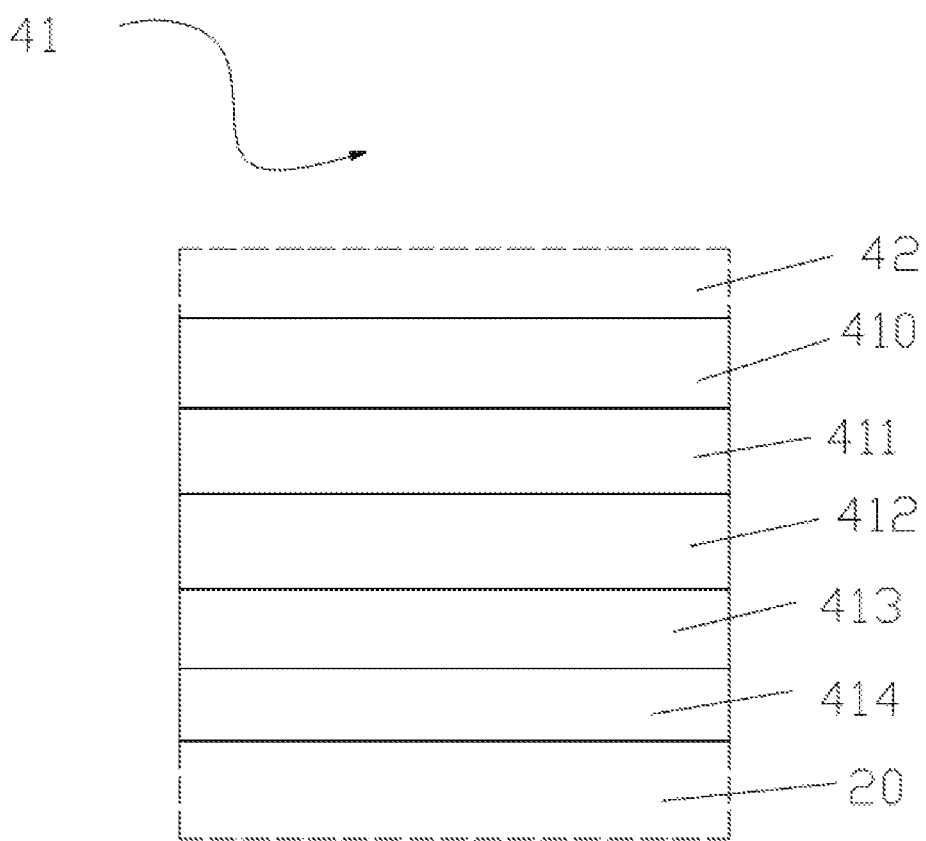
FIG. 2 schematically shows the structure of a first or second light transport layer in FIG. 1.

As shown in FIG. 2, the first light transport layer 41 comprises: a first conductive layer 410 in contact with the PN junction 42, a first protective layer 411 in contact with the first conductive layer 410, a second conductive layer 412 in contact with the first protective layer 411, a second protective layer 413 in contact with the second conductive layer 412, and a light-exiting layer 414 in contact with the second protective layer 413. That is, the first conductive layer 410, the first protective layer 411, the second conductive layer 412, the second protective layer 413, and the light-exiting layer 414 are provided in a stacked manner, and the first conductive layer 410 is in electrical contact with the PN junction 42, and the light-exiting layer 414 is in contact with the heterojunction layer group 20.

The first conductive layer 410 has a first refractive index n1 and a first thickness d1, the first protective layer 411 has a second refractive index n2 and a second thickness d2, the second conductive layer 412 has a third refractive index n3 and a third thickness d3, the second protective layer 413 has a fourth refractive index n4 and a fourth thickness d4, and the light-exiting layer 414 has a fifth refractive index n5 and a fifth thickness d5. wherein n1 is between 1.8 and 2.1, and d1 is between 20 nm and 80 nm; n2 is between 0.1 and 5, and d2 is between 0.5 nm and 10 nm; n3 is between 0.1 and 1.5, and d3 is between 5 nm and 50 nm; n4 is between 1.3 and 2.1, and d4 is between 0.5 nm and 25 nm; n5 is between 1.4 and 2.4, and d5 is between 20 nm and 80 nm. The inventors have found that, by constructing the first light transport layer 41 as these sub-layers, the refractive index of the first light transport layer 41 may be conveniently adjusted between 1.15 and 1.35, and at the same time, the thickness of the first light transport layer 41 is kept between 50 nm and 200 nm. In this way, the sunlight can be more efficiently irradiated into the stacked solar energy 1 to improve the efficiency of the stacked solar energy 1.

It should be understood that the number of the sub-layers of the first light transport layer 41 may be more or less (even, may be one layer), as long as the thickness and the refractive index thereof can satisfy the requirement, and are not described herein again.

The first conductive layer 410 comprises a conductive metal oxide, for example the material of the first conductive layer 410 is selected from one of $In_2O_3$, $SnO_2$, ZnO, ITO, AZO, IZO, ITiO, IZTO, and FTO. In ITO, the doping weight percentage of $Sn_2O$ is greater than 0 and less than or equal to 50%; in IZO, the doping weight percentage of ZnO is greater than 0 and less than or equal to 50%; in AZO, the doping weight percentage of $Al_2O_3$ is greater than 0 and less than or equal to 50%; in the ITiO, the doping weight percentage of $TiO_2$ is greater than 0 and less than or equal to 10%; in IZTO, the doping weight percentage of $TiO_2$ is greater than 0 and less than or equal to 10%, and the doping weight percentage of ZnO is greater than 0 and less than or equal to 40%; in FTO, the doping weight percentage of F is greater than 0 and less than or equal to 10%. The inventors have found that the use of the above materials not only achieves the required refractive index, but also has good electrical conductivity, reduces resistance, and contributes to the improvement in the efficiency of the stacked solar energy 1.

The first protective layer 411 comprises one of a metal, a conductive metal oxide, and a conductive metal nitride. For example, the metal may be one of Si, Ti, Al, Ni, Cr, and NiCr; the metal oxide may be one of ZnO, $TiO_2$, $SnO_2$, $SiO_2$, $Nb_2O_5$, and $Ta_2O_5$; the metal nitride may be one of TiN and $Si_3N_4$. The inventors have found that the materials selected for the first protective layer 411 not only achieve the required refractive index, but also have good anti-oxidation performance, which can prevent oxygen molecules from penetrating into the second conductive layer 412, thereby ensuring that the second conductive layer 412 has good electrical conductivity. In addition, since the first protective layer 411 has a small thickness, the metal oxide or the metal nitride also has good electrical conductivity due to the quantum tunneling effect, which contributes to the improvement of the efficiency of the stacked solar energy 1.

The second conductive layer 412 comprises a conductive material and inevitable metal oxide and/or metal nitride inclusions. For example, the conductive material is selected from one of Ag, Cu, Al, Mo, an Ag alloy, a Cu alloy, an Al alloy, and an Mo alloy. In a specific embodiment, in the Ag alloy layer, the weight ratio of Ag is greater than 50%, and the rest 50% may be one of metal elements such as Zn, Cu, In, Pt, Pd, Au, Nb, Nd, B, Bi, and Ni; in the Cu alloy, the weight ratio of Cu is greater than 50%, and the rest 50% may be one of metal elements such as Zn, Ag, In, Pt, Pd, Au, Nb, Nd, B, Bi, and Ni; in the Mo alloy layer, the weight ratio of Mo is greater than 80%, and the rest 20% may be one of metal elements such as Zn, Cu, In, Pt, Pd, Au, Nb, Nd, B, Bi, and Ni; in the Al alloy layer, the weight ratio of Al is greater than 80%, and the rest 20% may be one of metal elements such as Zn, Cu, In, Pt, Pd, Au, Nb, Nd, B, Bi, and Ni. The metal oxide and/or metal nitride inclusion is formed by oxidizing and nitriding the metal or alloy by introducing a small amount of oxygen and nitrogen in the process of coating the metal target. These metals or alloys have good conductivity, and even if they contain a small amount of metal oxide and/or nitride inclusions, the electrical conductivity of the second conductive layer 412 will not be weakened as a whole. In addition, these metal oxides and metal nitrides also improve the light transmittance of the second conductive layer 412. This contributes to the improvement in the efficiency of the stacked solar energy 1.

The second protective layer 413 comprises one of a non-metal oxide, a metal nitride, and a metal oxide. For example, the non-metal oxide, the metal nitride and the metal oxide may be TiN, ZnO, $TiO_2$, $SnO_2$, $SiO_2$, and $Si_3N_4$. The second protective layer 413 formed by these compounds has good weather resistance and water resistance, and the protective effect on the second conductive layer 412 is improved. Since the second protective layer 413 has a small thickness, the non-metal oxide, the metal nitride and the metal oxide also have good electrical conductivity due to the quantum tunneling effect, which enables the second protective layer 413 to have good electrical conductivity, and contributes to the improvement in the efficiency of the stacked solar energy 1.

The light-exiting layer 414 comprises one of a non-metal oxide, a non-metal nitride, a non-metal sulfide, a non-metal fluoride, and a non-metal carbide. For example, the material of the light-exiting layer 414 is selected from one of $TiO_2$, $SnO_2$, ZnO, $Nb_2O_5$, $Ta_2O_5$, $Si_3N_4$, ZnS, $SiO_2$, $Al_2O_3$, MgF, MgS, SiC, AZO, GZO, and YZO. These materials have higher refractive index, which contributes to meeting the refractive index requirements of the light extraction layer 200. In addition, due to the quantum tunneling effect, these compounds also have appropriate electrical conductivity, which can reduce the resistance of the light-exiting layer 414 (and the light extraction layer 200), thereby contributing to the improvement in the efficiency of the stacked solar energy 1.

As also shown in FIG. 1, the PN junction 42 comprises an N-type nano-silicon layer 420 in contact with the first light transport layer 41 and a P-type nano-silicon layer 421 on the N-type nano-silicon layer 420, and the P-type nano-silicon layer 421 is in contact with the hole transport layer 40. The inventors have found that the PN junction 42 not only amplifies the excitation effect on the excitation layer 11 but also effectively reduces the interface resistance, thereby contributing to the improvement in the efficiency of the stacked solar energy 1.

As still shown in FIG. 1, the heterojunction layer group 20 comprises: an N-type Si wafer 201; a first intrinsic amorphous silicon layer 202 on a first surface of the N-type Si wafer 201, the first intrinsic amorphous silicon layer 202 being doped with oxygen; an N-type amorphous silicon layer 203 on the first intrinsic amorphous silicon layer 202, the N-type amorphous silicon layer 203 forming the aforementioned second electron transport layer 203; a second intrinsic amorphous silicon layer 204 on a second surface of the N-type Si wafer 201, the second intrinsic amorphous silicon layer 204 being the same as the first intrinsic amorphous silicon layer 201; a P-type amorphous silicon layer 205 on the second intrinsic amorphous silicon layer 204, the P-type amorphous silicon layer 205 forming the second hole transport layer 205. The inventors have also found that, in the heterojunction layer group 20, the semiconductor layer groups on both sides of the N-type Si wafer 201 can be excited, so that the light excitation efficiency of the heterojunction layer group 20 is high, which contributes to further improving the amplification effect on the light excitation effect of the light absorption layer group 10, thereby further improving the efficiency of the stacked solar cell 1. Furthermore, the inventors have also found that doping oxygen in the first intrinsic amorphous silicon layer 202 and the second intrinsic amorphous silicon layer 204 may increase the light transmittance of the first intrinsic amorphous silicon layer 202 and the second intrinsic amorphous silicon layer 204, thereby further contributing to the improvement in the excitation effect of the heterojunction layer group 20, which further improves the efficiency of the stacked solar cell 1.

In a specific embodiment, the first intrinsic amorphous silicon layer 202 has an oxygen content of between 0 wt % and 30 wt %. It should be noted that the oxygen content in the first intrinsic amorphous silicon layer 202 is greater than zero. The inventors have found that, at such an oxygen doping concentration, the light transmittances of the first intrinsic amorphous silicon layer 202 and the second intrinsic amorphous silicon layer 204 are improved, and Si is not completely converted into $SiO_2$, so that the first intrinsic amorphous silicon layer 202 and the second intrinsic amorphous silicon layer 204 still have a high electron/hole transport effect, which further improves the efficiency of the stacked solar cell 1.

As also shown in FIG. 1, a second light transport layer 30 is further provided on an outer side of the P-type amorphous silicon layer 205, and the second light transport layer is the same as the first light transport layer 41; the P-type amorphous silicon layer 205 has a refractive index of between 3.2 and 3.8 and a thickness of between 0 nm and 60 nm. It should be noted that the thickness of the P-type amorphous silicon layer 205 is greater than zero. In this structure, the second light transport layer 30 and the P-type amorphous silicon layer 205 (i.e., the second hole transport layer 205) also form an anti-reflection layer, which contributes to the entering of sunlight inside of the heterojunction layer group 20 and excitation thereof, thereby contributing to the improvement of the efficiency of the stacked solar cell 1.

The first electron transport layer group 12 comprises an electron transport layer 120 in contact with the excitation layer 11 and a conductive layer 121 in contact with the electron transport layer 120. In a specific embodiment, a material of the conductive layer 121 is $In_2O_3$, and a dopant is one or more of $Ga_2O_3$, $ZnO^2$, $CeO_2$, $TiO_2$, $Mo_2O_3$, $ZrO_2$, and $WO_2$; wherein $In_2O_3$ has a weight content of between 80 wt % and 100 wt %, and the balance is a dopant and an inevitable impurity; or a material of the conductive layer 121 is ZnO, and a dopant is one or more of $SnO_2$, $Al_2O_3$, $Ga_2O_3$, and $B_2O_3$; wherein ZnO has a weight content of between 80 wt % and 100 wt %, and the balance is a dopant and an inevitable impurity. Compared with ITO used in the prior art, the material of the conductive layer 121 of the present application is not only better in light transmittance but also better in electrical conductivity, which contributes to further improving the efficiency of the stacked solar cell 1.

It should be also understood that the first metal electrode layer 50 is provided on an outer side of the conductive layer 121, and the second metal electrode layer 60 is provided on an outer side of the second light transport layer 30. The first electrode layer 50 and the second electrode layer 60 are used to connect with an external wire for conducting electricity, which will not be described herein.

Example 1

For the light absorption layer 10, the excitation layer 11 is a perovskite photosensitive layer FAPbI3. The electron transport layer 120 is SnO with a thickness of 20 nm. The conductive layer 121 is IMO (that is, $In_2O_3$ is doped with $Mo_2O_3$, and the content of $In_2O_3$ is 95 wt %), and the hole transport layer 40 is NiO.

For the PN junction 42, the P-type nano-silicon layer 421 has a thickness of 22 nm; the N-type nano-silicon layer 420 has a thickness of 28 nm.

For the light transport layer, the first light transport layer 41 is the same as the second light transport layer 30. The first conductive layer 410 is IZO with a thickness of 45 nm and a refractive index of 2.0; the first protective layer 411 is Ti with a thickness of 1 nm and a refractive index of 1.9; the second conductive layer 412 is a mixture of AgIn and $AgInO_x$ with a thickness of 8 nm and a refractive index of 0.3; the second protective layer 413 is ZnO with a thickness of 15 nm and a refractive index of 2.0; the light-exiting layer 414 is MgF with a thickness of 60 nm and a refractive index of 1.45.

For the heterojunction layer group 20, the N-type Si wafer 201 has a thickness of 0.2 mm; the first intrinsic amorphous silicon layer 202 and the second intrinsic amorphous silicon layer 204 have an oxygen content of 25 wt % and a thickness of 10 nm; the N-type amorphous silicon layer 203 has a thickness of 10 nm; the P-type amorphous silicon layer 205 has a thickness of 10 nm.

The first metal electrode layer 50 is an Ag paste; the second metal electrode layer 60 is an Ag paste.

The efficiency of the stacked solar cell of Example 1 is shown in Table 1.

Example 2

For the light absorption layer 10, the excitation layer 11 is a perovskite photosensitive layer FAPbI3. The electron transport layer 120 is ZnO with a thickness of 15 nm. The conductive layer 121 is IWO (that is, $In_2O_3$ is doped with $WO_2$, and the content of $In_2O_3$ is 98 wt %), and the hole transport layer 40 is $MoO_3$.

For the PN junction 42, the P-type nano-silicon layer 421 has a thickness of 20 nm; the N-type nano-silicon layer 420 has a thickness of 19 nm.

For the light transport layer, the first light transport layer 41 is the same as the second light transport layer 30. The first conductive layer 410 is ZnO with a thickness of 60 nm and a refractive index of 2.0; the first protective layer 411 is Si with a thickness of 1 nm and a refractive index of 3.8; the second conductive layer 412 is a mixture of AlTi and $AlTiO_x$ with a thickness of 15 nm and a refractive index of 1.0; the second protective layer 413 is YZO with a thickness of 25 nm and a refractive index of 2.0; the light-exiting layer 414 is SiC with a thickness of 75 nm and a refractive index of 1.55.

For the heterojunction layer group 20, the N-type Si wafer 201 has a thickness of 0.2 mm; the first intrinsic amorphous silicon layer 202 and the second intrinsic amorphous silicon layer 204 have an oxygen content of 20 wt % and a thickness of 7 nm; the N-type amorphous silicon layer 203 has a thickness of 10 nm; the P-type amorphous silicon layer 205 has a thickness of 10 nm.

The first metal electrode layer 50 is an Ag paste; the second metal electrode layer 60 is an Ag paste.

The efficiency of the stacked solar cell of Example 2 is shown in Table 1.

Example 3

For the light absorption layer 10, the excitation layer 11 is a perovskite photosensitive layer FAPbI3. The electron transport layer 120 is $SnO_2$ with a thickness of 15 nm. The conductive layer 121 is IWO (that is, $In_2O_3$ is doped with $WO_2$, and the content of $In_2O_3$ is 90 wt %), and the hole transport layer 40 is $WO_3$.

For the PN junction 42, the P-type nano-silicon layer 421 has a thickness of 16 nm; the N-type nano-silicon layer 420 has a thickness of 25 nm.

For the light transport layer, the first light transport layer 41 is the same as the second light transport layer 30. The first conductive layer 410 is FTO with a thickness of 60 nm and a refractive index of 1.9; the first protective layer 411 is Cr with a thickness of 1.5 nm and a refractive index of 2.7; the second conductive layer 412 is a mixture of AgZn and $AgZnO_x$ with a thickness of 9 nm and a refractive index of 0.3; the second protective layer 413 is $TiO_2$ with a thickness of 15 nm and a refractive index of 2.0; the light-exiting layer 414 is $Ta_2O_5$ with a thickness of 45 nm and a refractive index of 2.0.

For the heterojunction layer group 20, the N-type Si wafer 201 has a thickness of 0.2 mm; the first intrinsic amorphous silicon layer 202 and the second intrinsic amorphous silicon layer 204 have an oxygen content of 30 wt % and a thickness of 5 nm; the N-type amorphous silicon layer 203 has a thickness of 10 nm; the P-type amorphous silicon layer 205 has a thickness of 10 nm.

The first metal electrode layer 50 is an Ag paste; the second metal electrode layer 60 is an Ag paste.

The efficiency of the stacked solar cell of Example 3 is shown in Table 1.

Example 4

For the light absorption layer 10, the excitation layer 11 is a perovskite photosensitive layer FAPbI3. The electron transport layer 120 is $TiO_2$ with a thickness of 7 nm. The conductive layer 121 is AGZO (that is, ZnO is doped with $Al_2O_3$ and $Ga_2O_3$, the content of ZnO is 96 wt %, the content of $Al_2O_3$ is 2 wt %, and the balance is $Ga_2O_3$ and an inevitable impurity), and the hole transport layer 40 is $Cu_2O$.

For the PN junction 42, the P-type nano-silicon layer 421 has a thickness of 28 nm; the N-type nano-silicon layer 420 has a thickness of 10 nm.

For the light transport layer, the first light transport layer 41 is the same as the second light transport layer 30. The first conductive layer 410 is ITO with a thickness of 50 nm and a refractive index of 1.9; the first protective layer 411 is $SnO_2$ with a thickness of 5 nm and a refractive index of 2.0; the second conductive layer 412 is a mixture of CuNi and $CuNiN_x$ with a thickness of 20 nm and a refractive index of 0.9; the second protective layer 413 is $Si_3N_4$ with a thickness of 10 nm and a refractive index of 2.0; the light-exiting layer 414 is YZO with a thickness of 40 nm and a refractive index of 2.0.

For the heterojunction layer group 20, the N-type Si wafer 201 has a thickness of 0.2 mm; the first intrinsic amorphous silicon layer 202 and the second intrinsic amorphous silicon layer 204 have an oxygen content of 15 wt % and a thickness of 5 nm; the N-type amorphous silicon layer 203 has a thickness of 10 nm; the P-type amorphous silicon layer 205 has a thickness of 10 nm.

The first metal electrode layer 50 is an Ag paste; the second metal electrode layer 60 is an Ag paste.

The efficiency of the stacked solar cell of Example 4 is shown in Table 1.

Example 5

For the light absorption layer 10, the excitation layer 11 is a perovskite photosensitive layer FAPbI3. The electron transport layer 120 is $Al_2O_3$ with a thickness of 5 nm. The conductive layer 121 is BGZO (that is, ZnO is doped with $B_2O_3$ and $Ga_2O_3$, the content of ZnO is 98 wt %, the content of $B_2O_3$ is 1 wt %, the balance is $Ga_2O_3$ and an inevitable impurity), and the hole transport layer 40 is CuO.

For the PN junction 42, the P-type nano-silicon layer 421 has a thickness of 25 nm; the N-type nano-silicon layer 420 has a thickness of 25 nm.

For the light transport layer, the first light transport layer 41 is the same as the second light transport layer 30. The first conductive layer 410 is ITiO with a thickness of 38 nm and a refractive index of 2.0; the first protective layer 411 is Al with a thickness of 2 nm and a refractive index of 0.9; the second conductive layer 412 is a mixture of AgAl and $AgAlO_x$ with a thickness of 7 nm and a refractive index of 0.3; the second protective layer 413 is TiN with a thickness of 7 nm and a refractive index of 2.0; the light-exiting layer 414 is $SnO_2$ with a thickness of 40 nm and a refractive index of 2.0.

For the heterojunction layer group 20, the N-type Si wafer 201 has a thickness of 0.2 mm; the first intrinsic amorphous silicon layer 202 and the second intrinsic amorphous silicon layer 204 have an oxygen content of 20 wt % and a thickness of 6 nm; the N-type amorphous silicon layer 203 has a thickness of 10 nm; the P-type amorphous silicon layer 205 has a thickness of 10 nm.

The first metal electrode layer 50 is an Ag paste; the second metal electrode layer 60 is an Ag paste.

The efficiency of the stacked solar cell of Example 5 is shown in Table 1.

Comparative Example

The comparative example is a conventional perovskite solar cell of the prior art.

The excitation layer is a perovskite photosensitive layer FAPbI3. The electron transport layer is $SnO_2$. The hole transport layer is CuO.

The efficiency of the stacked solar cell of comparative example is shown in Table 1.

TABLE 1

| Serial number | Refractive index, thickness (nm) of the first light transport layer or the second light transport layer | Refractive index, thickness (nm) of the second electron transport layer | Refractive index, thickness (nm) of P-type amorphous silicon layer | Efficiency |
|---|---|---|---|---|
| Example 1 | 1.25/129 nm | 3.8/10 nm | 3.8/10 nm | 30.6% |
| Example 2 | 1.28/176 nm | 3.8/10 nm | 3.8/10 nm | 30.2% |
| Example 3 | 1.25/130.5 nm | 3.8/10 nm | 3.8/10 nm | 30.8% |
| Example 4 | 1.24/125 nm | 3.8/10 nm | 3.8/10 nm | 31.2% |
| Example 5 | 1.28/94 nm | 3.8/10 nm | 3.8/10 nm | 30.4% |
| Comparative Example | — | — | — | 19.4% |

As shown in Table 1, the efficiency of the stacked solar cells according to Examples 1-5 of the present application is high, all of which are 30% or more, whereas the efficiency of the solar cell in the prior art is about 20%, which indicates that the efficiency of the stacked solar cell according to the present application is higher.

The above description is only an example of the present application and is not intended to limit the present application. For those skilled in the art, various modifications and changes may occur in the present application. Any modification, equivalent, improvement and the like made without departing from the spirit and principle of the present application shall fall within the scope of the claims of present application.

What is claimed is:

1. A stacked solar cell, comprising:
a light absorption layer group comprising an excitation layer, a first electron transport layer group provided on a first side surface of the excitation layer, and a first hole transport layer group provided on a second side surface of the excitation layer; and
a heterojunction layer group, wherein a second electron transport layer is provided as a first side surface of the heterojunction layer group and is in contact with the first hole transport layer group, and a second hole transport layer is provided as a second side surface of the heterojunction layer group;
wherein the first hole transport layer group comprises a hole transport layer in contact with the excitation layer, a PN junction in contact with the hole transport layer, and a first light transport layer is in direct contact with an N-type layer of the PN junction, the first light transport layer is in direct contact with the second electron transport layer, and a refractive index of the first light transport layer is smaller than a refractive index of the second electron transport layer;
wherein under the irradiation of sunlight, both the excitation layer and the heterojunction layer group are excited, and an electron generated by the excitation layer is transported out of the stacked solar cell through the first electron transport layer; a hole generated by the excitation layer flows to the heterojunction layer group through the first hole transport layer group and recombines with an electron generated by the heterojunction layer group, and a hole generated by the heterojunction layer group is transported out of the stacked solar cell from the second hole transport layer.

2. The stacked solar cell according to claim 1, wherein the first light transport layer has a refractive index of between 1.15 and 1.35 and a thickness of between 50 nm and 200 nm; the second hole transport layer has a refractive index of between 3.5 and 4.2 and a thickness of between 0 nm and 30 nm.

3. The stacked solar cell according to claim 2, wherein the first light transport layer comprises:
a first conductive layer in contact with the PN junction,
a first protective layer in contact with the first conductive layer,
a second conductive layer in contact with the first protective layer,
a second protective layer in contact with the second conductive layer, and
a light-exiting layer in contact with the second protective layer,
wherein the first conductive layer has a first refractive index n1 and a first thickness d1, the first protective layer has a second refractive index n2 and a second thickness d2, the second conductive layer has a third refractive index n3 and a third thickness d3, the second protective layer has a fourth refractive index n4 and a fourth thickness d4, and the light-exiting layer has a fifth refractive index n5 and a fifth thickness d5;
wherein n1 is between 1.8 and 2.1, and d1 is between 20 nm and 80 nm; n2 is between 0.1 and 5, and d2 is between 0.5 nm and 10 nm; n3 is between 0.1 and 1.5, and d3 is between 5 nm and 50 nm; n4 is between 1.3 and 2.1, and d4 is between 0.5 nm and 25 nm; n5 is between 1.4 and 2.4, and d5 is between 20 nm and 80 nm.

4. The stacked solar cell according to claim 3, wherein the first conductive layer comprises a conductive metal oxide;
the first protective layer comprises one of a metal, a conductive metal oxide, and a conductive metal nitride;
the second conductive layer comprises a conductive material, and a metal oxide and/or a metal nitride; and
the second protective layer comprises one of a non-metal oxide, a metal nitride, and a metal oxide.

5. The stacked solar cell according to claim 4, wherein a material of the first conductive layer is selected from one of $In_2O_3$, $SnO_2$, ZnO, ITO, AZO, IZO, ITIO, IZTO, and FTO;
a material of the first protective layer is selected from one of Si, Ti, Al, Ni, Cr, NiCr, TiN, ZnO, $TiO_2$, $SnO_2$, $SiO_2$, $Nb_2O_5$, $Ta_2O_5$, and $Si_3N_4$;
the conductive material of the second conductive layer is selected from one of Ag, Cu, Al, Mo, an Ag alloy, a Cu alloy, an Al alloy, and an Mo alloy, and the second conductive layer further comprises an inclusion formed by an oxide and/or a nitride of the conductive material of the second conductive layer;

a material of the second protective layer is selected from one of TiN, ZnO, TiO$_2$, SnO$_2$, SiO$_2$, Si$_3$N$_4$, AZO, IZO, and YZO;

a material of the light-exiting layer is selected from one of TiO$_2$, SnO$_2$, ZnO, Nb$_2$O$_5$, Ta$_2$O$_5$, Si$_3$N$_4$, ZnS, SiO$_2$, Al$_2$O$_3$, MgF, MgS, SiC, AZO, GZO, and YZO.

6. The stacked solar cell according to claim 1, wherein the heterojunction layer group comprises:
   an N-type Si wafer;
   a first intrinsic amorphous silicon layer on a first surface of the N-type Si wafer, the first intrinsic amorphous silicon layer being doped with oxygen;
   an N-type amorphous silicon layer on the first intrinsic amorphous silicon layer, the N-type amorphous silicon layer forming the second electron transport layer;
   a second intrinsic amorphous silicon layer on a second surface of the N-type Si wafer; and
   a P-type amorphous silicon layer on the second intrinsic amorphous silicon layer, the P-type amorphous silicon layer forming the second hole transport layer.

7. The stacked solar cell according to claim 6, wherein the first intrinsic amorphous silicon layer has an oxygen content of between 0 wt % and 30 wt %.

8. The stacked solar cell according to claim 6, wherein a second light transport layer is further provided on an outer side of the P-type amorphous silicon layer, and the P-type amorphous silicon layer has a refractive index of between 3.2 and 3.8 and a thickness of between 0 nm and 60 nm.

9. The stacked solar cell according to claim 1, wherein in the PN junction the N-type layer is a nano-silicon layer and the PN junction comprises a P-type nano-silicon layer on the N-type nano-silicon layer, and the P-type nano-silicon layer is in contact with the hole transport layer.

10. The stacked solar cell according to claim 1, wherein the first electron transport layer group comprises an electron transport layer in contact with the excitation layer and a conductive layer in contact with the electron transport layer.

11. The stacked solar cell according to claim 10, wherein a material of the conductive layer is In$_2$O$_3$, and a dopant comprising one or more of Ga$_2$O$_3$, ZnO$_2$, CeO$_2$, TiO$_2$, Mo$_2$O$_3$, ZrO$_2$, and WO$_2$; wherein In$_2$O$_3$ has a weight content of between 80 wt % and 100 wt %, and the balance is the dopant and an inevitable impurity; or
   a material of the conductive layer is ZnO, and a dopant comprising one or more of SnO$_2$, Al$_2$O$_3$, Ga$_2$O$_3$, and B$_2$O$_3$; wherein ZnO has a weight content of between 80 wt % and 100 wt %, and the balance is the dopant and an inevitable impurity.

12. The stacked solar cell according to claim 2, wherein the heterojunction layer group comprises:
   an N-type Si wafer;
   a first intrinsic amorphous silicon layer on a first surface of the N-type Si wafer, the first intrinsic amorphous silicon layer being doped with oxygen;
   an N-type amorphous silicon layer on the first intrinsic amorphous silicon layer, the N-type amorphous silicon layer forming the second electron transport layer;
   a second intrinsic amorphous silicon layer on a second surface of the N-type Si wafer; and
   a P-type amorphous silicon layer on the second intrinsic amorphous silicon layer, the P-type amorphous silicon layer forming the second hole transport layer.

13. The stacked solar cell according to claim 3, wherein the heterojunction layer group comprises:
   an N-type Si wafer;
   a first intrinsic amorphous silicon layer on a first surface of the N-type Si wafer, the first intrinsic amorphous silicon layer being doped with oxygen;
   an N-type amorphous silicon layer on the first intrinsic amorphous silicon layer, the N-type amorphous silicon layer forming the second electron transport layer;
   a second intrinsic amorphous silicon layer on a second surface of the N-type Si wafer; and
   a P-type amorphous silicon layer on the second intrinsic amorphous silicon layer, the P-type amorphous silicon layer forming the second hole transport layer.

14. The stacked solar cell according to claim 4, wherein the heterojunction layer group comprises:
   an N-type Si wafer;
   a first intrinsic amorphous silicon layer on a first surface of the N-type Si wafer, the first intrinsic amorphous silicon layer being doped with oxygen;
   an N-type amorphous silicon layer on the first intrinsic amorphous silicon layer, the N-type amorphous silicon layer forming the second electron transport layer;
   a second intrinsic amorphous silicon layer on a second surface of the N-type Si wafer; and
   a P-type amorphous silicon layer on the second intrinsic amorphous silicon layer, the P-type amorphous silicon layer forming the second hole transport layer.

15. The stacked solar cell according to claim 5, wherein the heterojunction layer group comprises:
   an N-type Si wafer;
   a first intrinsic amorphous silicon layer on a first surface of the N-type Si wafer, the first intrinsic amorphous silicon layer being doped with oxygen;
   an N-type amorphous silicon layer on the first intrinsic amorphous silicon layer, the N-type amorphous silicon layer forming the second electron transport layer;
   a second intrinsic amorphous silicon layer on a second surface of the N-type Si wafer; and
   a P-type amorphous silicon layer on the second intrinsic amorphous silicon layer, the P-type amorphous silicon layer forming the second hole transport layer.

16. The stacked solar cell according to claim 2, wherein in the PN junction the N-type layer is a nano-silicon layer and the PN junction comprises a P-type nano-silicon layer on the N-type nano-silicon layer, and the P-type nano-silicon layer is in contact with the hole transport layer.

17. The stacked solar cell according to claim 3, wherein in the PN junction the N-type layer is a nano-silicon layer and the PN junction comprises a P-type nano-silicon layer on the N-type nano-silicon layer, and the P-type nano-silicon layer is in contact with the hole transport layer.

18. The stacked solar cell according to claim 4, wherein in the PN junction the N-type layer is a nano-silicon layer and the PN junction comprises a P-type nano-silicon layer on the N-type nano-silicon layer, and the P-type nano-silicon layer is in contact with the hole transport layer.

19. The stacked solar cell according to claim 5, wherein in the PN junction the N-type layer is a nano-silicon layer and the PN junction comprises a P-type nano-silicon layer on the N-type nano-silicon layer, and the P-type nano-silicon layer is in contact with the hole transport layer.

* * * * *